(12) United States Patent
Wada

(10) Patent No.: US 8,418,358 B2
(45) Date of Patent: Apr. 16, 2013

(54) WIRING BOARD WITH BUILT-IN COMPONENT AND METHOD FOR MANUFACTURING WIRING BOARD WITH BUILT-IN COMPONENT

(75) Inventor: Yoshiyuki Wada, Fukuoka (JP)

(73) Assignee: Panasonic Corporation, Osaka (JP)

( * ) Notice: Subject to any disclaimer, the term of this patent is extended or adjusted under 35 U.S.C. 154(b) by 411 days.

(21) Appl. No.: 12/680,979

(22) PCT Filed: Oct. 6, 2008

(86) PCT No.: PCT/JP2008/002810
§ 371 (c)(1),
(2), (4) Date: Mar. 31, 2010

(87) PCT Pub. No.: WO2009/054098
PCT Pub. Date: Apr. 30, 2009

(65) Prior Publication Data
US 2010/0206621 A1   Aug. 19, 2010

(30) Foreign Application Priority Data
Oct. 25, 2007   (JP) ................................. 2007-277318

(51) Int. Cl.
*H05K 3/30* (2006.01)
(52) U.S. Cl.
USPC ............. 29/841; 29/25.01; 29/592; 29/592.1; 29/825; 29/832
(58) Field of Classification Search ..................... 29/841, 29/25.01, 855, 592, 592.1, 825, 829, 832
See application file for complete search history.

(56) References Cited

U.S. PATENT DOCUMENTS

| 7,053,475 B2 * | 5/2006 | Akagawa ....................... 257/686 |
| 7,894,200 B2 | 2/2011 | Yoshino et al. |
| 2009/0008765 A1 | 1/2009 | Yamano et al. |
| 2011/0090657 A1 | 4/2011 | Yoshino et al. |

FOREIGN PATENT DOCUMENTS

| JP | 2004-311736 A |   | 11/2004 |
| JP | 2004311736 A | * | 11/2004 |
| JP | 2006-093493 A |   | 4/2006 |
| JP | 2006-093493 A |   | 4/2006 |

(Continued)

OTHER PUBLICATIONS

JP Office Action for 2007-277318, Apr. 5, 2011, p. 2 references Cite Nos. 2-7.

*Primary Examiner* — Livius R Cazan
*Assistant Examiner* — Azm Parvez
(74) *Attorney, Agent, or Firm* — RatnerPrestia

(57) ABSTRACT

A wiring board with a built-in component includes an insulating board, a first wiring pattern on an upper surface of the insulating board, plural electrodes on the upper surface of the insulating board, a solder resist on the upper surface of the insulating board, plural solders on the electrodes, respectively, an electronic component joined to the electrodes with the solders, a sealing resin provided between the insulating board and the electronic component, a component-fixing layer provided on the upper surface of the insulating board and the first wiring pattern and having an insulating property, a second wiring pattern on the component-fixing layer, and an interlayer wiring connecting the first wiring pattern to the second wiring pattern. The solder resist surrounds the electrodes. The sealing resin entirely covers the solders and the solder resist. This wiring board can be efficiently manufactured by simple processes.

10 Claims, 9 Drawing Sheets

FOREIGN PATENT DOCUMENTS

| | | |
|---|---|---|
| JP | 2007-049004 A | 2/2007 |
| JP | 2007-214230 A | 8/2007 |
| JP | 2007-214230 A | 8/2007 |
| JP | 2007-214535 A | 8/2007 |
| JP | 2007-214535 A | 8/2007 |
| JP | 2009164435 A * | 7/2009 |
| WO | WO2007/069606 A1 | 6/2007 |

* cited by examiner

WIRING BOARD WITH BUILT-IN COMPONENT AND METHOD FOR MANUFACTURING WIRING BOARD WITH BUILT-IN COMPONENT

This application is a U.S. national phase application of PCT INTERNATIONAL APPLICATION PCT/JP2008/002810.

TECHNICAL FIELD

The present invention relates to a wiring board with a built-in component including a core layer on which an electronic component is mounted and a method for manufacturing a wiring board with a built-in component.

BACKGROUND ART

According to the development of electronic devices having a more sophisticated function and a smaller size, a circuit board has been required to be capable of having electronic components mounted thereto at a high density.

The circuit board disclosed in Patent Document 1 includes a print wiring board having plurality wiring layers and an electronic component mounted to an inner layer out of the wiring layers. This electronic component is, e.g. a chip component, such as a chip capacitor. Thus, a part of such an electronic component to be mounted on an outer layer of a print wiring board is accommodated in the board, electronic components can be mounted on the print wiring board at a high density.

Electronic components accommodated in a print wiring board are often limited to be a passive component, such as a capacitor and a resistor. Active components, such as semiconductor devices can be mounted at a limited density on the entire circuit board. In order to allow the active components to be accommodated in the print wiring board, complicated processes, such as a process for making a cavity for accommodating the active component and a process for sealing the active component, are required.

Patent Document 1: JP2007-214230A

SUMMARY OF THE INVENTION

A wiring board with a built-in component includes an insulating board, a first wiring pattern on an upper surface of the insulating board, plural electrodes on the upper surface of the insulating board, a solder resist on the upper surface of the insulating board, plural solders on the electrodes, respectively, an electronic component joined to the electrodes with the solders, a sealing resin provided between the insulating board and the electronic component, a component-fixing layer provided on the upper surface of the insulating board and the first wiring pattern and having an insulating property, a second wiring pattern on the component-fixing layer, and an interlayer wiring connecting the first wiring pattern to the second wiring pattern. The solder resist surrounds the electrodes. The sealing resin entirely covers the solders and the solder resist.

This wiring board can be efficiently manufactured by simple processes.

REFERENCE NUMERALS

2 Insulating Board
3 Wiring Pattern (First Wiring Pattern)
4 Solder Resist
6 Solder Bump
7 Electronic Component
9 Sealing Resin 9A Resin Material (Second Resin Material)
12 Prepreg (First Prepreg)
13 Wiring Layer
14 Prepreg (Second Prepreg)
15 Metal Foil
15A Wiring Pattern (Second Wiring Pattern)
19 Layered Structure
20 Interlayer Wiring
21 Wiring Board with Built-in Component
22 Resin Material (First Resin Material)
51 Flux
103 Electrode
106 Solder
109 Sealing Resin
109A Resin Material
112 Component-Fixing Layer
221 Wiring Board with a Built-in Component

DETAILED DESCRIPTION OF PREFERRED EMBODIMENTS

Exemplary Embodiment 1

FIGS. 1A to 1E and 2A to 2D are cross-sectional views of a wiring board with a built-in component for illustrating a method for manufacturing the wiring board according to Exemplary Embodiment 1 of the present invention.

FIGS. 1A to 1E are cross-sectional views of core layer 1 for illustrating a method for manufacturing core layer 1.

Figure 1A:
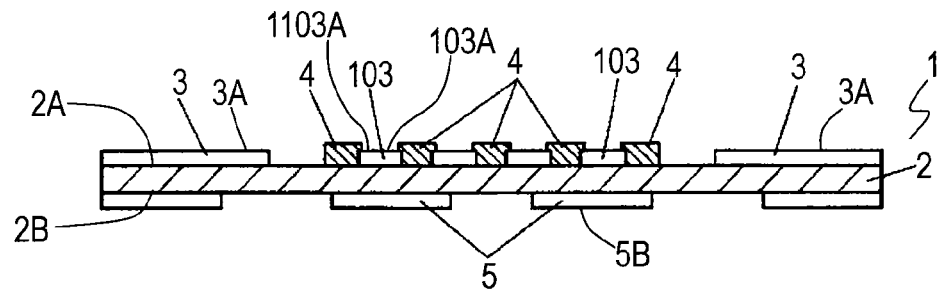
FIG. 1A is a cross-sectional view of a wiring board with a built-in component for illustrating a method for manufacturing the wiring board according to Exemplary Embodiment 1 of the present invention.

As shown in FIG. 1A, core layer 1 includes insulating board 2 having upper surface 2A and lower surface 2B opposite to upper surface 2A. Core layer 1 further includes wiring pattern 3 provided on upper surface 2A, electrodes 103 provided on upper surface 2A, solder resist 4 provided on upper surface 2A, and wiring pattern 5 provided on lower surface 2B. Insulating board 2 is made of insulating material, such as resin or ceramic. Solder resist 4 is made of insulating material and surrounds electrodes 103 such that electrodes 103 faces each other across solder resists 4. Upper surface 103A of electrode 103 has portion 1103A exposed from solder resist 4.

Figure 1B:
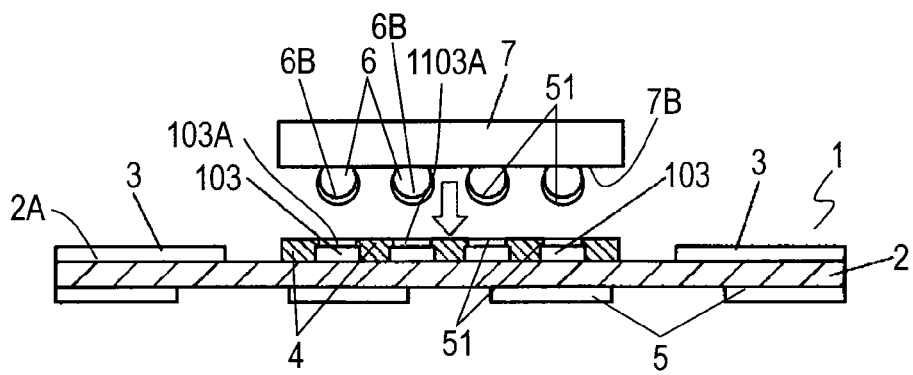
FIG. 1B is a cross-sectional view of the wiring board for illustrating the method for manufacturing the wiring board according to Embodiment 1.

As shown in FIG. 1B, electronic component 7 has solder bumps 6. Solder bumps 6 are provided on lower surface 7B of electronic component 7. Solder bumps 6 are placed on electrodes 103 to place electronic component 7 on core layer 1. Portion 1103A of upper surface 103A of electrode 103 exposed from solder resist 4 contacts lower end 6B of solder bump 6. Before solder bump 6 contact electrode 103, flux 51 for solder joint is coated on solder bump 6 or upper surface 103A of electrode 1036. Activator contained in flux 51 removes an oxide film produced on a surface of solder bump 6 and upper surface 103A of electrode 103.

Figure 1C:
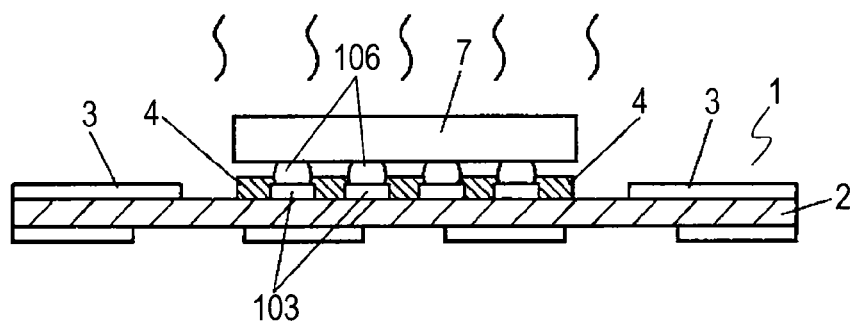
FIG. 1C is a cross-sectional view of the wiring board for illustrating the method for manufacturing the wiring board according to Embodiment 1.

Core layer 1 having electronic component 7 mounted thereon is sent to a reflow apparatus and is heated for solder joint. Then, as shown in FIG. 1C, solder bump 6 is molten and solidified to provide solder 106 jointing electronic component 7 to portion 1103A of electrode 103. Solder resist 4 surrounding electrode 103 prevents molten solder bump 6 from flowing out of portion 1103A of upper surface 103A of electrode 103. Thus, solder 106 is prevented from expanding to the outside of electrode 103, hence forming solder 106 having an appropriate shape.

Figure 1D:
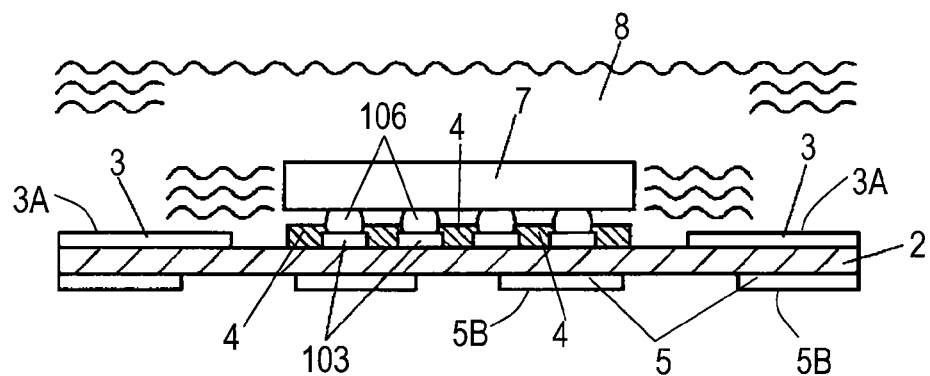
FIG. 1D is a cross-sectional view of the wiring board for illustrating the method for manufacturing the wiring board according to Embodiment 1.

Core layer 1 having electronic component 7 joined thereto is sent to a cleaning apparatus. When solder 106 is formed, at least a part of coated flux 51 may remain around solder 106. As shown in FIG. 1D, core layer 1 with electronic component 7 joined thereto is vibrated with ultrasonic waves while being immersed in cleaning agent 8 in a cleaning bath. Then, solder 106 joining electrode 103 to electronic component 7 is cleaned to remove unnecessary residue, such as the part of flux 51, remaining around solder 106. When electronic component 7 is joined at solder 106 and then core layer 1 is heated so as to mount another electronic component on the wiring board, solder 106 may be molten again. The remaining part of flux 51 may cause molten solder 106 to flow due to the activator contained in flux 51, thereby deforming the shape of solder 106. The removal of the remaining part of flux 51 prevents molten solder 106 from flowing. In addition to the above method of immersing core layer 1 in cleaning agent 8, another method, such as the spraying of cleaning agent to core layer 1, may be used to clean core layer 1.

Figure 1E:
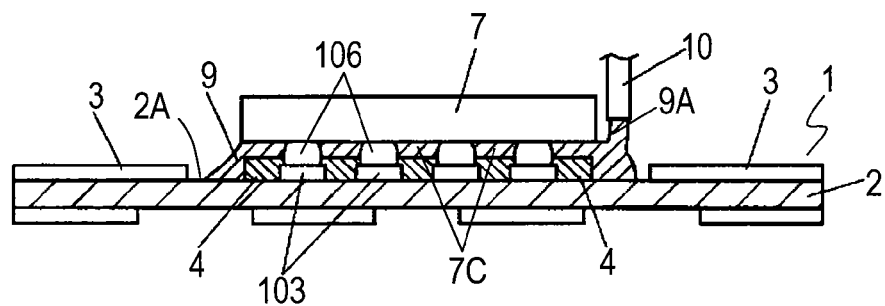
FIG. 1E is a cross-sectional view of the wiring board for illustrating the method for manufacturing the wiring board according to Embodiment 1.

Next, as shown in FIG. 1E, resin material 9A, such as epoxy resin, fills gap 7C between core layer 1 and electronic component 7 around electronic component 7 with dispenser 10, and then, is cured, so as to provide sealing resin 9 filling gap 7C for reinforcing the wiring board from a periphery of solder 106. Sealing resin 9 is provided between insulating board 2 and electronic component 7 to entirely cover solder 106, electrode 103, and solder resist 4.

Figure 2A:
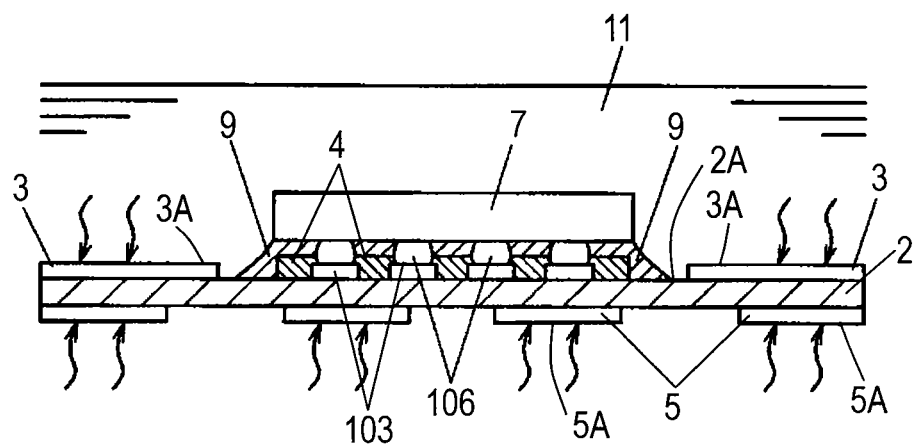
FIG. 2A is a cross-sectional view of the wiring board for illustrating the method for manufacturing the wiring board according to Embodiment 1.

Then, as shown in FIG. 2A, core layer 1 is immersed in processing liquid 11, such as strong acid solution, to blackening core layer 1. Processing liquid 11 oxidizes and roughens upper surface 3A of wiring pattern 3 and lower surface 5B of wiring pattern 5. This process produces an anchor pattern with fine roughness on surfaces 3A and 5B. Solder 106 covered by sealing resin 9 prevents processing liquid 11 from reaching solder 106, thus preventing solder 106 from being influenced by processing liquid 11.

Figure 2B:
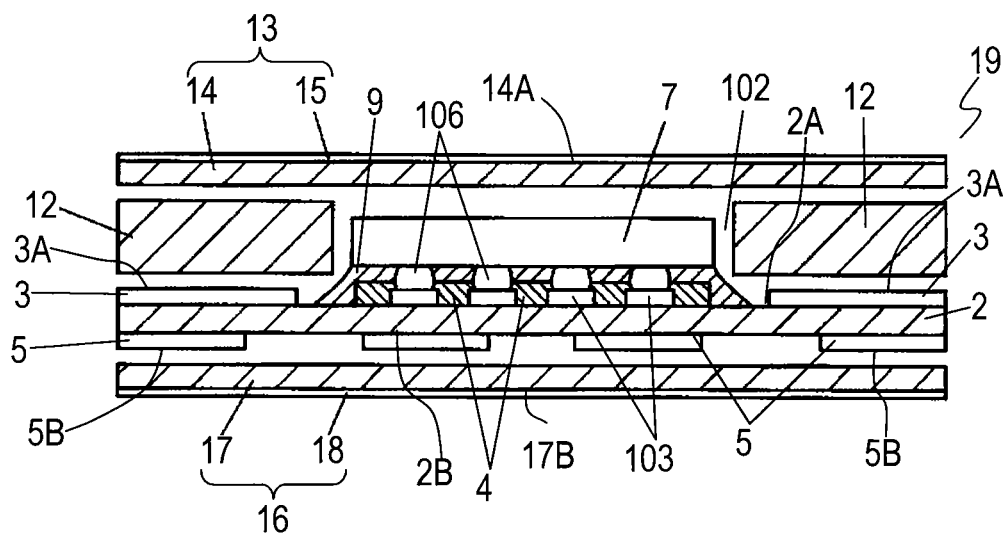
FIG. 2B is a cross-sectional view of the wiring board for illustrating the method for manufacturing the wiring board according to Embodiment 1.

Then, as shown in FIG. 2B, prepreg 12 having opening 102 is placed on upper surface 2A of insulating board 2 of core layer 1 and on upper surface 3A of wiring pattern 3 such that electronic component 7 is positioned in opening 102. Wiring layer 13 is placed on upper surface 12A of prepreg 12. Wiring layer 13 includes prepreg 14 and metal foil 15, such as a copper foil, adhered to an upper surface of prepreg 14. Wiring layer 16 is placed on lower surface 2B of insulating board 2 and on lower surface 5B of wiring pattern 5. Wiring layer 16 includes prepreg 17 and metal foil 18, such as a copper foil, adhered to lower surface 17B of prepreg 17. Prepregs 14 and 17 have a board shape. This process provides layered structure 19 including core layer 1, electronic component 7, prepreg 12, and wiring layers 13 and 16. Prepregs 12, 14, and 17 are impregnated with thermosetting resin, such as epoxy resin.

Figure 2C:
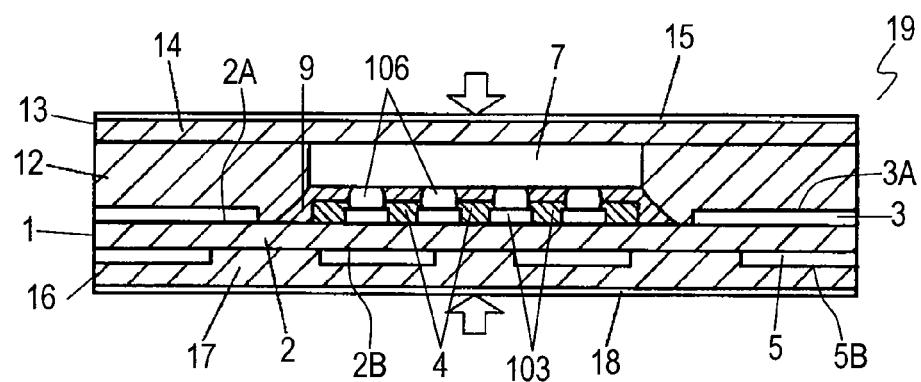
FIG. 2C is a cross-sectional view of the wiring board for illustrating the method for manufacturing the wiring board according to Embodiment 1.

Next, as shown in FIG. 2C, layered structure 19 is heated at a temperature ranging from about 150° C. to 200° C. while being pressurized with a pressing machine at a pressure of about 30 kg/cm². This process softens the resin impregnated in prepregs 14, 12, and 17 and fuses each other at interfaces on which the prepregs contacting each other. At this moment, prepreg 12 is adhered to upper surface 3A of wiring pattern 3, and prepreg 17 is adhered to lower surface 5B of wiring pattern 5. The fine anchor pattern of upper surface 3A and lower surface 5B allows prepregs 12 and 17 to be firmly adhered to surfaces 3A and 5B. The resin impregnated in prepregs 12 and 14 fills gaps between electronic component 7 and prepregs 12 and 14 in opening 102 to integrate prepregs 12 and 14 to each other, thereby forming component-fixing layer 112 that covers and fixes electronic component 7 and sealing resin 9. Component-fixing layer 112 has an insulating property. Upon being heated and pressurized, prepregs 14 and 17 are fused and cured to provide insulating layers in wiring layers 13 and 16, respectively.

Figure 2D:
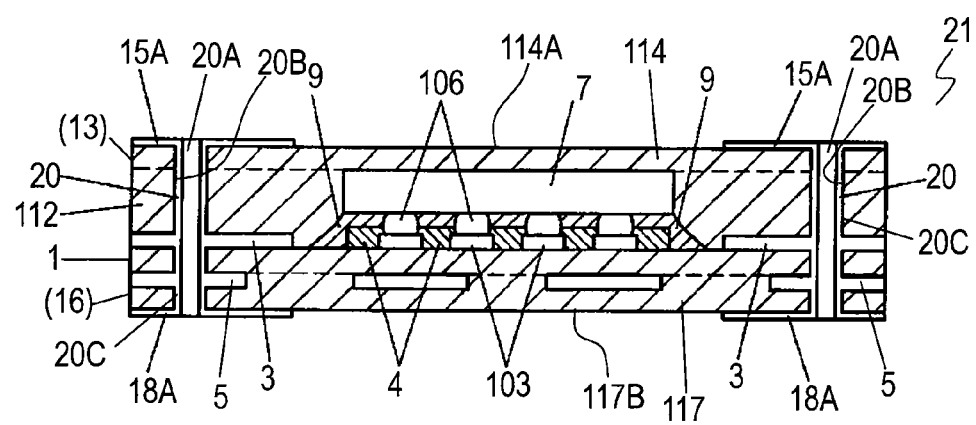
FIG. 2D is a cross-sectional view of the wiring board for illustrating the method for manufacturing the wiring board according to Embodiment 1.

Next, as shown in FIG. 2D, through-hole 20A passing in through layered structure 19 is formed. Conductive layer 20C is formed on inner surface 20B of through-hole 20A by plating. This process provides interlayer wiring 20 connecting wiring patterns 3 and 5 of core layer 1 to metal foils 15 and 18 of wiring layers 13 and 16. Then, metal foils 15 and 18 of wiring layers 13 and 16 are patterned to form wiring patterns 15A and 18A, respectively.

By the above method, wiring board 21 with a built-in component, as shown in FIG. 2D, including core layer 1, wiring layers 13 and 16, and electronic component 7 mounted on core layer 1 is produced. Electronic component 7 is joined to electrode 103 provided on upper surface 2A of insulating board 2 of core layer 1 via solder 106. Wiring layers 13 and 16 includes insulating layers 114 and 117 obtained by solidifying prepregs 14 and 17 and wiring patterns 15A and 18A provided in insulating layers 114 and 117, respectively. Insulating layer 114 is a part of component-fixing layer 112. Wiring pattern 15A made of metal foil 15 is provided on upper surface 114A of component-fixing layer 112, i.e., insulating layer 114.

Figure 3A:
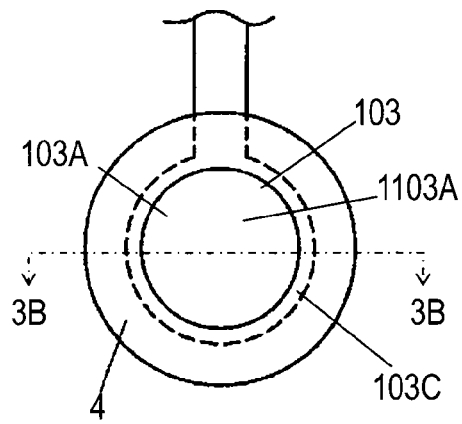
FIG. 3A is a plan view of a solder resist of the wiring board according to Embodiment 1.
Figure 3B:
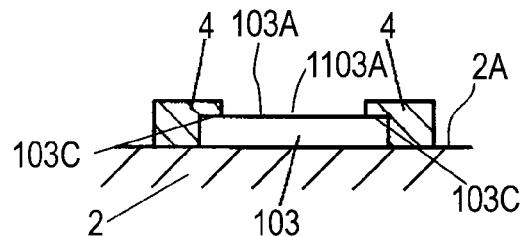
FIG. 3B is a cross-sectional view of the solder resist at line 3B-3B shown in FIG. 3A.

FIG. 3A is a plan view of electrode 103 and solder resist 4 of wiring board 21 with a built-in component. FIG. 3B is a cross-sectional view of electrode 103 and solder resist 4 on line 3B-3B shown in FIG. 3A. Electrode 103 having a circular shape is provided on upper surface 2A of insulating board 2, and has upper surface 103A. Solder resist 4 having an annular shape provided on upper surface 2A of insulating board 2, and entirely surrounds electrode 103 so as to cover outer edge 103C of upper surface 103A of electrode 103. Upper surface 103A of electrode 103 has portion 1103A that is exposed from solder resist 4, e.g., that is not covered by solder resist 4. Solder resist 4 is higher than portion 1103A of upper surface 103A of electrode 103, and prevents solder bump 6 and solder 106 from flowing out of portion 1103A even when solder bump 6 and solder 106 placed on portion 1103A of electrode 103 are molten.

Figure 3C:
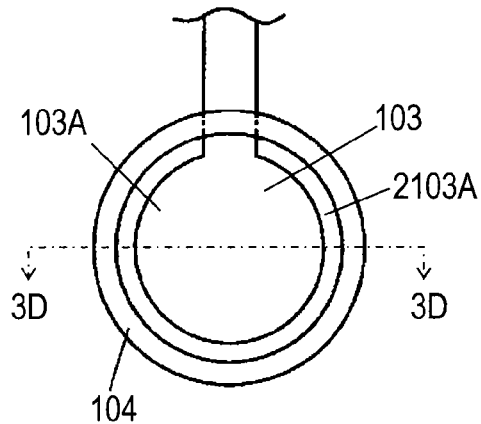
FIG. 3C is a plan view of another solder resist of the wiring board according to Embodiment 1.
Figure 3D:
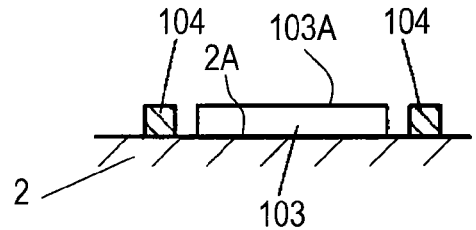
FIG. 3D is a cross-sectional view of the solder resist at line 3D-3D shown in FIG. 3C.

FIG. 3C is a plan view of electrode 103 and another solder resist 104 of wiring board 21 with a built-in component according to Embodiment 1. FIG. 3D is a cross-sectional view of electrode 103 and solder resist 104 on line 3D-3D shown in FIG. 3C. Solder resist 104 has an annular shape and is provided on upper surface 2A of insulating board 2. Solder resist 104 entirely surrounds electrode 103 and is located away from electrode 103 and via space 2103A. Upper surface 2A of insulating board 2 is exposed from space 2103A. Solder bump 6 is placed on upper surface 103A of electrode 103. Even when solder bump 6 and solder 106 provided on portion 1103A of electrode 103 are molten, solder bump 6 and solder 106 remain in space 2103A. Thus, solder resist 4 prevents molten solder bump 6 and solder 106 from flowing to the outside of solder resist 4.

Figure 3E:
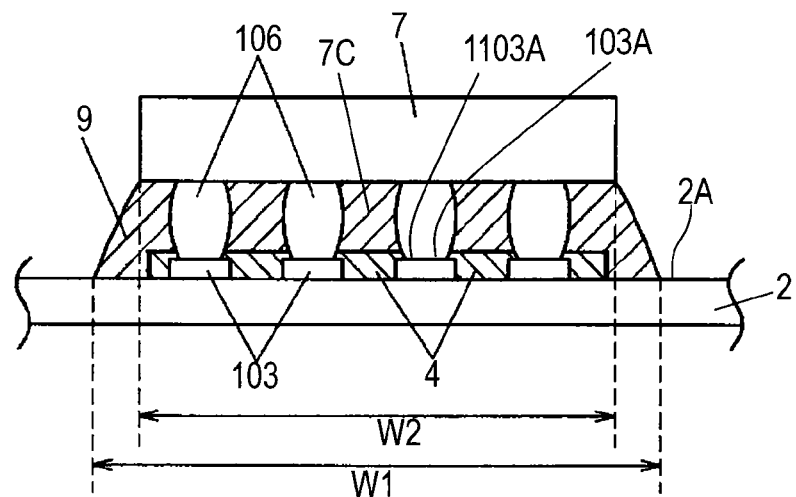
FIG. 3E is an enlarged cross-sectional view of the wiring board according to Embodiment 1.

FIG. 3E is an enlarged cross-sectional view of wiring board 21 with a built-in component. Solder resist 4 prevents molten solder 106 from excessively flowing to prevent a solder bridge. However, solder resist 4 is adhered prepreg 12 not so firmly. Thus, an increase of the ratio at which solder resist 4 occupies the surface of core layer 1 decreases the adhesion strength with which prepreg 12 is adhered to core layer 1.

According to Embodiment 1, solder resist 4 is positioned within width W1 of sealing resin 9 and does not protrude from sealing resin 9. Component-fixing layer 112 is provided on upper surface 2A of insulating board 2 and wiring pattern 3 to entirely cover electronic component 7 and sealing resin layer 109. This structure secures a function to prevent the solder bridge of solder resist 4 and a function to completely cover solder 106 during the blackening of sealing resin 9 to protect solder 106 from processing liquid 11. This structure also can prevent the adhesion strength between prepreg 12 and core layer 1 from deteriorating due to an excessive area of solder resist 4. In order to prevents the adhesion strength between prepreg 12 and core layer 1 from deteriorating, solder resist 4 may be provided preferably within width W2 of electronic component 7 to prevent solder resist 4 from protruding to the outside of width W2.

Figure 3F:
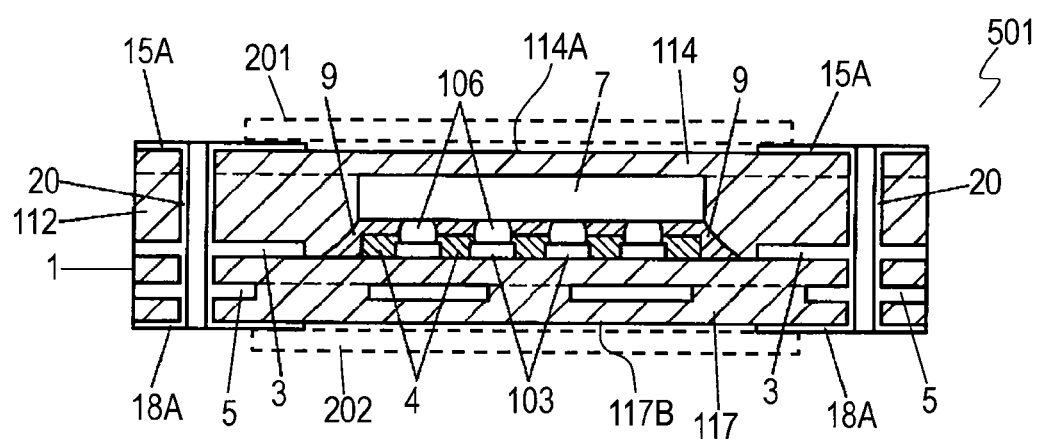
FIG. 3F is a cross-sectional view of a mounting board according to Embodiment 1.

FIG. 3F is a cross-sectional view of component-mounting board 501 according to Embodiment 1. Component-mounting board 501 includes: wiring board 21 with a built-in component, electronic component 201 mounted on upper surface 114A of insulating layer 114, and electronic component 202 mounted on lower surface 117B of insulating layer 117. Electronic components 201 and 202 are connected to wiring patterns 15A and 18A, respectively. Specifically, upper surface 114A of wiring board 21 is adapted to have electronic component 201 mounted thereon. Lower surface 117B of wiring board 21 is adapted to have electronic component 202 mounted thereon. Wiring patterns 15A and 18A are adapted to be connected to electronic components 201 and 202, respectively. As described above, wiring board 21 with a built-in component allows electronic components 7, 201, and 202 to be mounted with a high density. Furthermore, electronic component 7 mounted on core layer 1 significantly reduce the manufacture cost of wiring board 21 with a built-in component.

Exemplary Embodiment 2

Figure 4A:
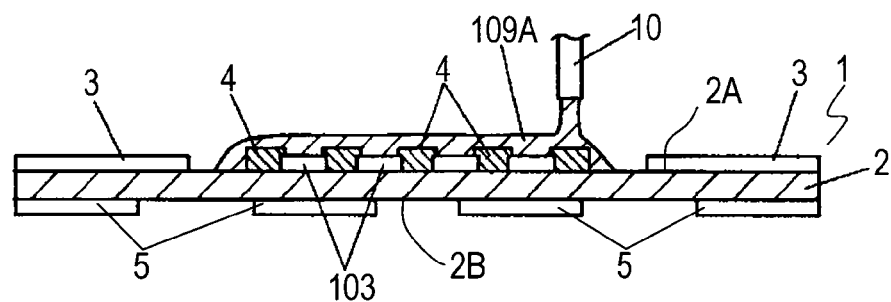
FIG. 4A is a cross-sectional view of a wiring board with a built-in component for illustrating a method for manufacturing the wiring board according to Exemplary Embodiment 2 of the invention.
Figure 4B:
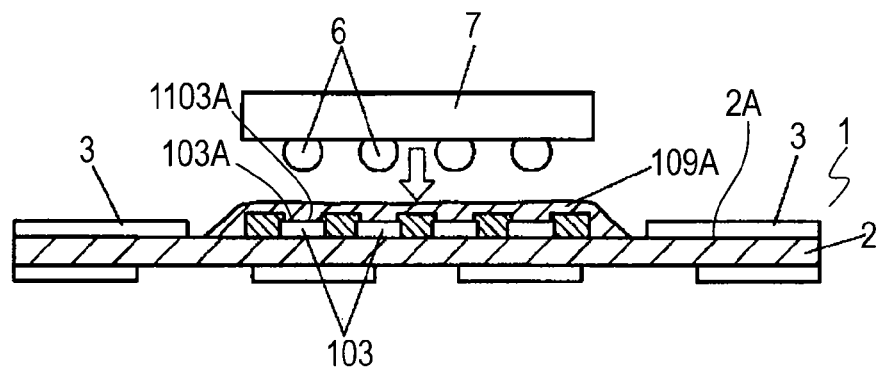
FIG. 4B is a cross-sectional view of the wiring board for illustrating the method for manufacturing the wiring board according to Embodiment 2.
Figure 4C:
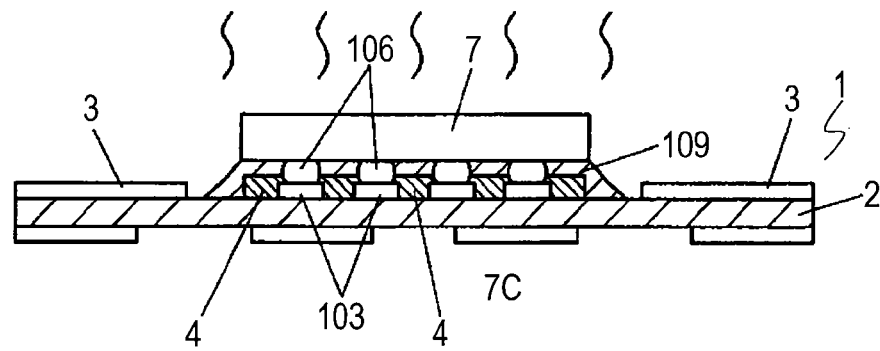
FIG. 4C is a cross-sectional view of the wiring board for illustrating the method for manufacturing the wiring board according to Embodiment 2.

FIGS. 4A to 4C are cross-sectional views of a wiring board with a built-in component for illustrating a method for manufacturing the wiring board according to Exemplary Embodiment 2 of the present invention. In FIGS. 4A to 4C, the same components identical to those of wiring board 21 shown in FIGS. 1A to 1E are denoted by the same reference numerals, and their description will be omitted. According to Embodiment 1, electronic component 7 is joined with solder 106, and then, resin material 9A is supplied to form sealing resin 9. According to Embodiment 2, before electronic component 7 is provided on core layer 1, resin material 109A is applied onto core layer 1.

As shown in FIG. 4A, resin material 109A is supplied to upper surface 2A of the insulating board of core layer 1 so as to cover electrode 103. Resin material 109A contains thermosetting resin, such as epoxy resin, and activator, such as organic acid. Resin material 109A may contain metal particles, such as solder particles or silver particles.

Next, as shown in FIG. 4B, electronic component 7 is provided on core layer 1 such that solder bump 6 is positioned on portion 1103A of upper surface 103A of electrode 103 through applied resin material 109A. At this moment, the activator contained in resin material 109A removes an oxide film produced on a surface of solder bump 6.

As shown in FIG. 4C, core layer 1 having electronic component 7 mounted thereon is sent to a reflow apparatus and is heated, thereby melting solder bump 6. Molten solder bump 6 is solidified to form solder 106. Solder 106 joins electronic component 7 to electrode 103. This heating cures the thermosetting resin contained in resin material 109A to form sealing resin 9 that seals gap 7C between electronic component 7 and core layer 1.

After sealing resin 9 is formed, wiring board 21 with a built-in component is manufactured by the method shown in FIGS. 2A to 2C according to Embodiment 1, thus providing component-mounting board 501 shown in FIG. 3E.

After solder 106 is formed, the activator contained in resin material 109A is dissolved as solid solution in sealing resin 9. Specifically, sealing resin 9 prevents the activator from remaining on solder 106. Thus, even when solder 106 is heated to mount electronic components 201 and 202 shown in FIG. 3F and is molten again, solder 106 does not flow to the outside of electrode 103. This can eliminate the process for cleaning core layer 1 shown in FIG. 1D according to Embodiment 1, thus allowing component-mounting board 501 shown in FIG. 3F to be manufactured with a simpler process.

Exemplary Embodiment 3

Figure 5A:
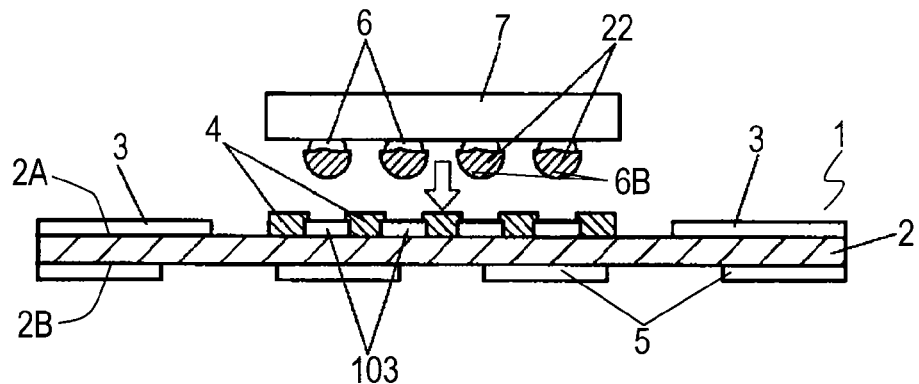
FIG. 5A is a cross-sectional view of a wiring board with a built-in component for illustrating a method for manufacturing the wiring board according to Exemplary Embodiment 3 of the invention.
Figure 5B:
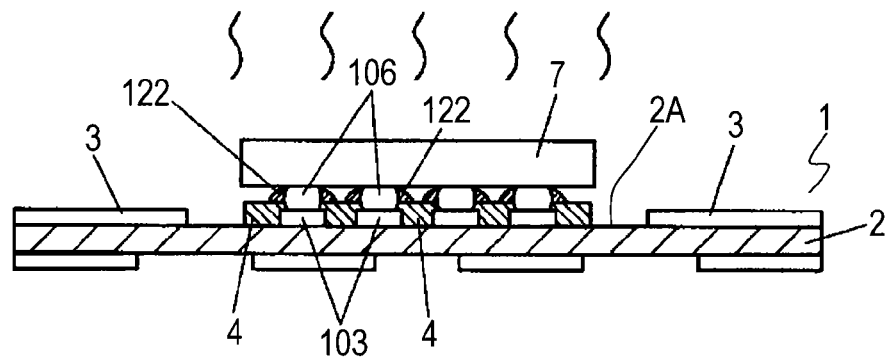
FIG. 5B is a cross-sectional view of the wiring board for illustrating the method for manufacturing the wiring board according to Embodiment 3.
Figure 5C:
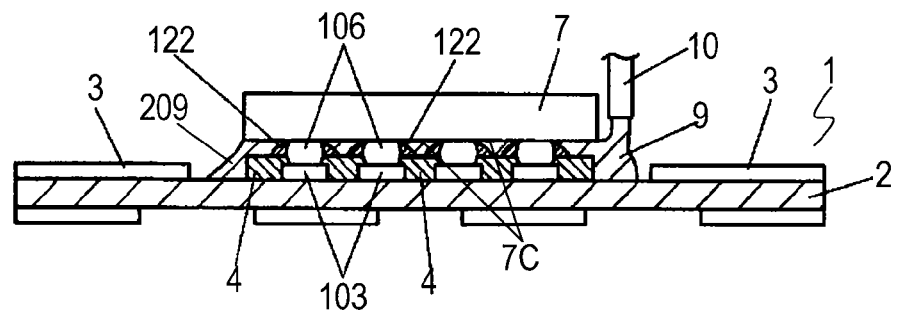
FIG. 5C is a cross-sectional view of the wiring board for illustrating the method for manufacturing the wiring board according to Embodiment 3.

FIGS. 5A to 5C are cross-sectional views of a wiring board with a built-in component for illustrating a method for manufacturing the wiring board according to Embodiment 3 of the present invention. In FIGS. 5A to 5C, components identical to those of wiring board 21 shown in FIGS. 1A to 1E are denoted by the same reference numerals, and their description will be omitted.

As shown in FIG. 5A, electronic component 7 is mounted to upper surface 2A of insulating board 2 of core layer 1 shown in FIG. 1A via solder bump 6. Resin material 22 is applied onto lower end 6B of solder bump 6 of electronic component 7. After resin material 22 is spread over a flat surface, solder bump 6 is pressed onto the flat surface to contact resin material 22 to transfer resin material 22 to solder bump 6. Resin material 22 contains thermosetting resin, such as epoxy resin, and activator, such as organic acid. The activator has an activating function to remove an oxide film produced on a surface of solder bump 6. Resin material 22 may contain metal particles, such as solder particles or silver particles.

Next, as shown in FIG. 5B, after resin material 22 is applied onto solder bump 6, electronic component 7 is placed on core layer 1. Then, solder bump 6 having resin material 22 thereon is placed on electrode 103. Core layer 1 having electronic component 7 thereon is sent to a reflow apparatus and is heat to melt solder bump 6. Molten solder bump 6 is solidified to form solder 106 joining electronic component 7 to electrode 103. This heating cures the thermosetting resin of resin material 22, thereby forming resin coating 122 covers a part or an entire of solder 106.

Next, as shown in FIG. 5C, resin material 9A, such as epoxy resin, is put in gap 7C between core layer 1 and electronic component 7 around electronic component 7 with dispenser 10. Resin material 9A is then cured to provide sealing resin 209 that seals gap 7C to reinforce solder 106.

Figure 6:
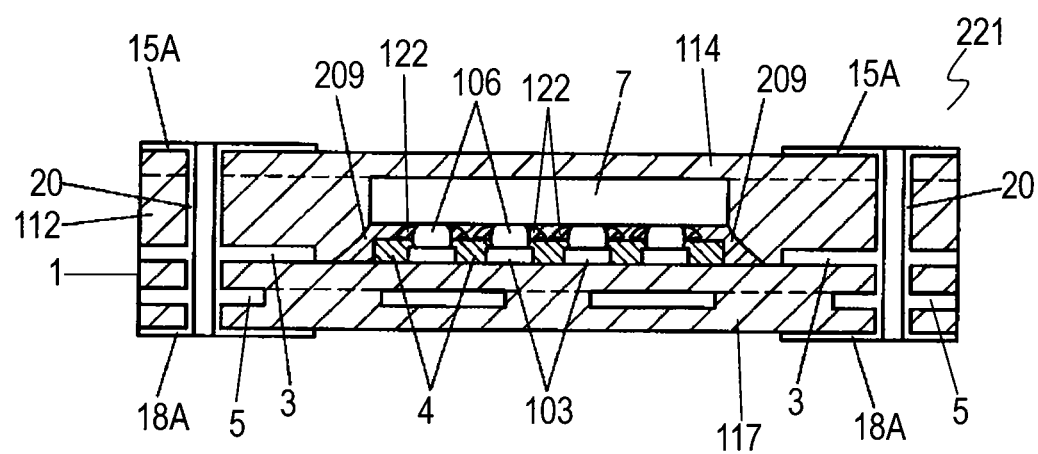
FIG. 6 is a cross-sectional view of the wiring board according to Embodiment 3.

FIG. 6 is a cross-sectional view of wiring board 221 with a built-in component according to Embodiment 3. In FIG. 6, components identical to those of wiring board 21 shown in FIG. 2D are denoted by the same reference numerals, and their description will be omitted. After sealing resin 209 is formed, wiring board 221 is manufactured by the method shown in FIGS. 2A to 2C according to Embodiment 1. In wiring board 221 with a built-in component, sealing resin 209 further covers resin coating 122 covering solder 106.

After solder 106 is formed, the activator contained in resin material 22 is dissolved as solid solution in resin coating 122. Specifically, resin coating 122 prevents the activator from remaining on solder 106. Thus, even when solder 106 is heated and melted again to mount electronic components 201 and 202 shown in FIG. 3F, solder 106 does not flow to the outside of electrode 103. This process can eliminate the process for cleaning core layer 1 shown in FIG. 1D according to Embodiment 1, thus allowing component mounting board 501 shown in FIG. 3F to be manufactured with a simple process.

In Embodiments 1 to 3, terms, as "upper surface" and "lower surface", indicating directions merely indicate relative directions depending on components, such as electronic components, of the wiring board, and do not indicate absolute directions, such as a vertical direction.

INDUSTRIAL APPLICABILITY

A wiring board with a built-in component according to the present invention can be efficiently manufactured by simple processes, and is useful for a wiring board having electronic components mounted thereto at a high density.

The invention claimed is:

1. A method for manufacturing a wiring board with a built-in component, comprising:
    preparing a core layer which includes
        an insulating board having an upper surface,
        a first wiring pattern provided on the upper surface of the insulating board,
        an electrode provided on the upper surface of the insulating board, and
        a solder resist provided on the upper surface of the insulating board and surrounding the plurality of electrodes;
    providing an electronic component having a solder bump;
    applying a flux on the electrode or the solder bump;
    placing the electronic component on the core layer such that the solder bump is placed on the electrode after applying the flux;
    forming a solder joining the electronic component to the electrode by melting and solidifying the solder bump, such that at least a part of the applied flux remains around the solder;
    cleaning the solder and removing at least the part of the remaining flux,
    putting and curing resin material between the electronic component and the core layer after said cleaning the solder;
    forming a sealing resin entirely covering the solder and the solder resist at a gap between the electronic component and the core layer;
    after said forming the sealing resin, roughening an upper surface of the first wiring pattern;
    providing a prepreg covering the electronic component and the roughened upper surface of the first wiring pattern;
    forming a layered structure by providing a metal foil on an upper surface of the prepreg;
    forming, by heating the layered structure, a component-fixing layer in which the prepreg fixes the core layer, the electronic component, and the metal foil; and
    forming an interlayer wiring connecting the first wiring pattern to the metal foil.

2. The method according to claim 1, wherein the solder resist prevents the molten solder bump from flowing to an outside of the solder resist.

3. The method according to claim 1, wherein
    the prepreg includes a second prepreg having an opening therein and a second prepreg having a board shape,
    said providing the prepreg comprises placing the first prepreg on the roughened upper surface of the first wiring pattern such that the electronic component is positioned in the opening of the first prepreg, and
    said forming the layered structure comprises:
        providing a wiring layer including the second prepreg and the metal foil adhered onto an upper surface of the second prepreg; and
        placing the wiring layer on the first prepreg such that the second prepreg is positioned on the first prepreg.

4. The method according to claim 1, wherein said roughening the upper surface of the first wiring pattern comprises roughening the upper surface of the first wiring pattern by oxidizing the upper surface of the first wiring pattern.

5. The method according to claim 1, further comprising forming a second wiring pattern by patterning the metal foil.

6. A method for manufacturing a wiring board with a built-in component, comprising:
    preparing a core layer which includes
        an insulating board having an upper surface,
        a first wiring pattern provided on the upper surface of the insulating board
        an electrode provided on the upper surface of the insulating board, and
        a solder resist provided on the upper surface of the insulating board and surrounding the plurality of electrodes;
    providing an electronic component having a solder bump;
    placing the electronic component on the core layer such that the solder bump is placed on the electrode;
    forming a solder joining the electronic component to the electrode by melting and solidifying the solder bump;
    forming a sealing resin entirely covering the solder and the solder resist at a gap between the electronic component and the core layer;
    after said forming the sealing resin, roughening an upper surface of the first wiring pattern;
    providing a prepreg covering the electronic component and the roughened upper surface of the first wiring pattern;
    forming a layered structure by providing a metal foil on an upper surface of the prepreg;
    forming, by heating the layered structure, a component-fixing layer in which the prepreg fixes the core layer, the electronic component, and the metal foil;
    forming an interlayer wiring connecting the first wiring pattern to the metal foil;
    said forming the sealing resin comprises, before said placing the electronic component on the core layer, supplying resin material onto the upper surface of the insulating board, the electrode, and the solder resist, and
    said placing the electronic component on the core layer comprises placing the electronic component on the core layer such that the solder bump is placed on the electrode through the applied resin material.

7. The method according to claim 6, wherein: the resin material contains activator for removing an oxide film on the solder.

8. A method for manufacturing a wiring board with a built-in component, comprising:
    Preparing a core layer which includes
        an insulating board having an upper surface,
        a first wiring pattern provided on the upper surface of the insulating board,
        an electrode provided on the upper surface of the insulating board, and
        a solder resist provided on the upper surface of the insulating board and surrounding the plurality of electrodes;
    providing an electronic component having a solder bump;
    placing the electronic component on the core layer such that the solder bump is placed on the electrode;
    forming a solder joining the electronic component to the electrode by melting and solidifying the solder bump;
    forming a sealing resin entirely covering the solder and the solder resist at a gap between the electronic component and the core layer;
    after said forming the sealing resin, roughening an upper surface of the first wiring pattern;
    providing a prepreg covering the electronic component and the roughened upper surface of the first wiring pattern;
    forming a layered structure by providing a metal foil on an upper surface of the prepreg;
    forming, by heating the layered structure, a component-fixing layer in which the prepreg fixes the core layer, the electronic component, and the metal foil; and
    forming an interlayer wiring connecting the first wiring pattern to the metal foil;
    before said placing the electronic component on the core layer, applying first resin material on the solder bump, wherein
    said placing the electronic component on the core layer comprises placing the electronic component on the core layer such that the solder bump is placed on the electrode through the coated resin material.

9. The method according to claim 8, wherein the first resin material contains activator for removing an oxide film on the solder.

10. The method according to claim 8, wherein said forming the sealing resin comprises, after said placing the electronic component on the core layer, putting and curing a second resin material between the electronic component and the core layer.

* * * * *